United States Patent
Fulmer et al.

(10) Patent No.: US 6,407,645 B1
(45) Date of Patent: Jun. 18, 2002

(54) AUTOMATED VOLTAGE CONTROL OSCILLATOR TUNING

(75) Inventors: William Edward Fulmer, Sinking Spring; Michael J Koziel, Reading; Curtis J Miller, West Lawn; Mark J Nelson, Reading; Johannes Gerardus Ransijn, Wyomissing Hills, all of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/495,154

(22) Filed: Jan. 31, 2000

(51) Int. Cl.[7] .............................. H03B 5/18; H03B 7/12
(52) U.S. Cl. ................... 331/96; 331/107 SL; 333/204; 333/205
(58) Field of Search .............................. 331/96, 107 SL, 331/107 DP, 177 R, 108 C, 117 D; 333/204, 205, 208, 209

(56) References Cited

U.S. PATENT DOCUMENTS

| | | | |
|---|---|---|---|
| 4,639,691 A | 1/1987 | Iigima | 331/99 |
| 4,769,883 A | 9/1988 | Oakes et al. | 29/25.42 |
| 5,115,217 A | 5/1992 | McGrath et al. | 333/246 |
| 5,486,797 A * | 1/1996 | Suzuki | 333/104 |
| 5,537,098 A * | 7/1996 | Patrick et al. | 340/825.05 |
| 5,708,397 A * | 1/1998 | Furutani et al. | 331/107 SL |
| 5,861,706 A * | 1/1999 | Lapatovich et al. | 313/113 |
| 5,901,241 A | 5/1999 | Koljonen et al. | 382/150 |
| 5,982,244 A | 11/1999 | Fujisaki | 331/99 |

OTHER PUBLICATIONS

Search Report, May 11, 2001, EPO.

* cited by examiner

Primary Examiner—Tuan T. Lam
(74) Attorney, Agent, or Firm—David L. Smith

(57) ABSTRACT

There is disclosed a first stub short bonded across conductive runners of a tuning stub at a distance preferably greater than a distance resulting in the desired frequency of operation of a voltage controlled oscillator tuned by the tuning stub. Thereafter, the voltage controlled oscillator is powered and tested to determine the frequency of operation of the voltage controlled oscillator. The position of a second stub short is determined based on the frequency of oscillation of the oscillator due to the presence of the first stub short, the geometry of the tuning stub and the desired frequency of operation of the voltage controlled oscillator. A second stub short is precisely positioned along the stub using automated equipment, relative to the position of the first stub short, to result in the desired frequency of operation of the voltage controlled oscillator. Depending on the relative positions of the first and second stub shorts relative to the voltage controlled oscillator, the first stub short may be removed. The voltage controlled oscillator may again be powered and tested to confirm the desired frequency of operation of the voltage controlled oscillator.

18 Claims, 3 Drawing Sheets

AUTOMATED VOLTAGE CONTROL OSCILLATOR TUNING

FIELD OF THE INVENTION

This invention relates to tuning voltage controlled oscillators, and in particular to automated tuning of a voltage controlled oscillator using a wire bonder to precisely establish the frequency of operation of the voltage controlled oscillator.

BACKGROUND OF THE INVENTION

Voltage controlled oscillators often have a tuning stub that is used to fine-tune the frequency of operation of the voltage controlled oscillator. A stub is employed to establish the frequency of operation of the voltage controlled oscillator. A stub short placed across conductive runners of the stub determines the frequency of operation of the voltage controlled oscillator. Prior techniques placed a stub short at a location along the stub that produced approximately the desired frequency of operation of the voltage controlled oscillator. The voltage controlled oscillator was powered and tested to determine the frequency of operation due to the presence of the stub short. The position of a second stub short relative to the first stub short was determined that would result in the desired frequency of operation of the voltage controlled oscillator. The position of the second stub short was manually measured relative to the first stub short and manually bonded along the stub to fine-tune the frequency of operation of the voltage controlled oscillator. The voltage controlled oscillator was again powered and the frequency of operation of the voltage controlled oscillator resulting from the presence of the second stub short was determined. If the second stub short, which was manually positioned along the stub, resulted in the desired frequency of operation of the voltage controlled oscillator, the fine-tuning was concluded. However, if the second stub short was not precisely positioned along the stub, the frequency of operation of the voltage controlled oscillator was not at the desired frequency, the second stub short may have to be removed, and the process was repeated to fine-tune the frequency of operation of the voltage controlled oscillator.

A shortcoming of the prior art technique was that the position of the second stub short was manually measured along the stub and manually secured, such as by soldering or thermosonic welding, in place. The stub short, which is often a wire, may require being positioned with an accuracy that is less than the diameter of a cross section. Since the frequency of operation of the voltage controlled oscillator is dependent on precise positioning of the stub short along the stub, any deviation from the position that would result in the desired frequency of operation would cause the voltage controlled oscillator to operate at an undesired frequency of operation. In such cases, the stub short may have to be removed and another attempt to position and secure a short stub undertaken to establish operation of the voltage controlled oscillator at the desired frequency of operation. Such iterative steps are very costly.

Thus, what is needed is a technique for precisely positioning a stub short along a stub for tuning a voltage controlled oscillator such that precise positioning of the stub short results in the desired frequency of operation of the voltage controlled oscillator. Such a technique would reduce the cost of fine tuning the voltage controlled oscillator.

SUMMARY OF THE INVENTION

In accordance with the invention, fine tuning the operation of a stub tunable device includes placing a first stub short across conductive runners of a tuning stub at a distance preferably greater than a distance resulting in the desired tuning dependent variable of the stub tunable device. Thereafter, the stub tunable device is powered and tested to determine an initial tuning dependent variable of operation of the stub tunable device. The position of a second stub short is determined based on the tuning dependent variable of the stub tunable device due to the presence of the first stub short, the geometry of the tuning stub and the desired of the stub tunable device. A second stub short is precisely positioned along the stub using automated equipment, relative to the position of the first stub short, to result in the desired tuning dependent variable of the stub tunable device. Depending on the relative positions of the first and second stub shorts relative to the stub tunable device, the first stub short may be removed. Only the stub short that results in the shortest stub length influences the tuning dependent variable. Should the second stub short require being located along the stub to result in a longer stub, then the first stub short must be modified, such as being severed or removed, so as not to influence the tuning dependent variable. The stub tunable device may again be powered and tested to confirm the desired tuning dependent variable of the stub tunable device.

DETAILED DESCRIPTION

Figure 1:
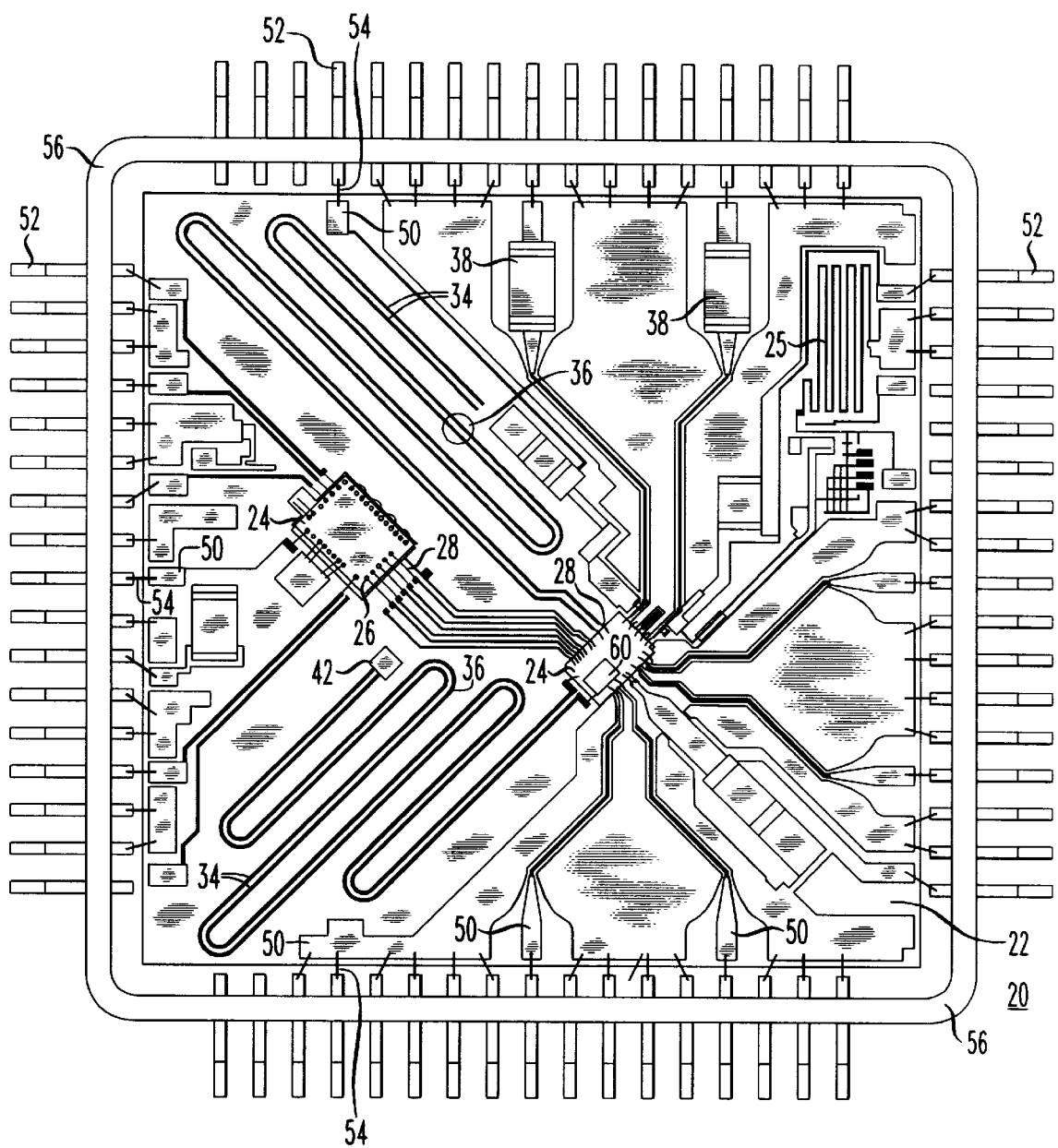
FIG. 1 is a top view of a hybrid integrated circuit having a voltage controlled oscillator tuned in accordance with the present invention.

FIG. 1 is a hybrid integrated circuit 20 including a voltage controlled oscillator 60 having a tuning stub, or transmission line, tuned in accordance with an illustrative embodiment of the invention. A voltage controlled oscillator will be described although the invention is not limited thereto. Any stub tunable device, including but not limited to phase shifter, delay line, timing transition detector, impedance matching, and oscillators controlled by other than voltage, may utilize the invention.

Hybrid integrated circuit 20 includes a substrate 22 on which many components 25, including one or more integrated circuits 24 are placed. In a preferred embodiment substrate 22 is ceramic, although the invention is not limited thereto. Any appropriate substrate material will suffice. Integrated circuits 24 may be manufactured by any known process including but not limited to Si, GaAs, InP, or SiGe. Bond pads 26 on integrated circuit 24 are connected by wire bonds 28 to other components located outside integrated circuits 24 including but are not limited to interconnects 32, conductive runners 34 of a tuning stub 36, capacitors 38 and other devices or structures adhered to substrate 22 such as by solder, bonding or epoxy. The invention is not limited to wire interconnects. Interconnects can be manufactured by any known process, including but not limited to flip-chip, tape-automated-bonding, or ribbon.

Hybrid integrated circuit 20 includes bond pads 50 around the periphery which are coupled to leads 52 by wire bonds 54. Leads 52 extend through package portion 56 in which hybrid integrated circuit 20 is housed. A lid, cover or overmolding, not shown in FIG. 1, supplements package portion 56 to enclose substrate 22 in a package. There may be more than one voltage controlled oscillator having a tuning stub tuned for fine tuning the frequency of operation in accordance with the present invention.

In fine-tuning a voltage controlled oscillator 60, a tuning stub 36 having conductive runners 34 is employed to establish the frequency of operation of voltage controlled oscillator 60. Conductive runners 34a and 34b are shorted by a stub short 62 at some distance from ends of runners 34a and 34b coupled to bond pads 26a and 26b. Runners 34 form a transmission line, with ends 42 distant from bond pads 26a and 26b coupled by a via to ground. Shorting the conductive runner changes the effective length of the transmission length. When runners 34 are a metal, stub short 62 may, for example, be a wire that is bonded to each runner, forming stub 36. The stub 36 establishes an inductance that cooperates with inherent capacitance to form a tank circuit. In operation, voltage controlled oscillator 60 sends a signal out on one bond pad such as bond pad 26a and receives the signal back on another bond pad, such as bond pad 26b. The voltage controlled oscillator signal passes from bond pad 26a through wire bond 28a thence conductive runner 34a, stub short 62, conductive runner 34b, and wire bond 28b to bond pad 26b. The stub length is determined by the position of stub short 62 along conductive runners 34a and 34b. Due at least in part to the stub length, a time delay is introduced into the signal that determines the frequency of operation of voltage controlled oscillator 60. The longer the stub length and hence the longer the time delay, the lower the frequency of operation of voltage controlled oscillator 60. The shorter the stub length and hence the shorter the time delay, the higher the frequency of operation of the voltage controlled oscillator 60.

A portion of the circuitry for a voltage controlled oscillator 60 in the illustrative embodiment resides on integrated circuit 24. The voltage controlled oscillator 60 is coupled to conductive runners 34a and 34b of a tuning stub 36 such as through bond pads 26a and 26b and wire bonds 28a and 28b. Conductive runners 34a and 34b in the illustrative embodiment are two generally parallel trace structures that are laid out on a surface of substrate 24, although the invention is not limited to generally parallel trace structures as conductive runners. In a preferred embodiment, conductive runners 34a and 34b are a metal such as gold. One skilled in the art would know how to deposit conductive runners on a substrate.

When the length and width dimensions of a substrate 22 permit, coupled with the layout of components on substrate 22, conductive runners 34 may be straight structures. However, since conductive runners 34 are relatively long and relatively narrow, often the layout of components on substrate 22 will not accommodate conductive runners 34 that are straight structures. Conductive runners 34 are not limited to being linear. Conductive runners 34a and 34b may serpentine back and forth to provide a longer physical length in an area of substrate 22 having a limited height and width.

Each runner 34 forming a tuning stub need not be of the same length. When runners 34 are straight structures similar to line segments, both runners forming a tuning stub may be the same length. However, when conductive runners 34 are not straight structures similar to line segments, such as when conductive runners include a change in direction or serpentine, one conductive runner of a tuning stub may be of a different length, such as longer or shorter, than the other conductive runner of a tuning stub. Tuning stub 36 having conductive runners 34 that differ from those described herein are within the scope of the invention. By way of example and not limitation, the conductive runners 34 may be on opposite sides of substrate 22, may be of non-uniform cross-section, or may be structurally different from each other such as a transmission line and ground plane.

As stated above, a stub short shorting the conductive runners of a stub determines the stub length and hence frequency of operation of the voltage controlled oscillator 60. When there are two or more stub shorts at spaced locations along conductive runners of a stub, only the stub short resulting in the shorter stub length, and hence the stub short that introduces the smaller time delay, impacts operation of the voltage controlled oscillator 60 to determine the frequency of operation thereof. The operating frequency of a voltage controlled oscillator may be adjusted, or fine-tuned, knowing that only the stub short resulting in the shorter stub length determines the frequency of operation of a voltage controlled oscillator.

Figure 2:
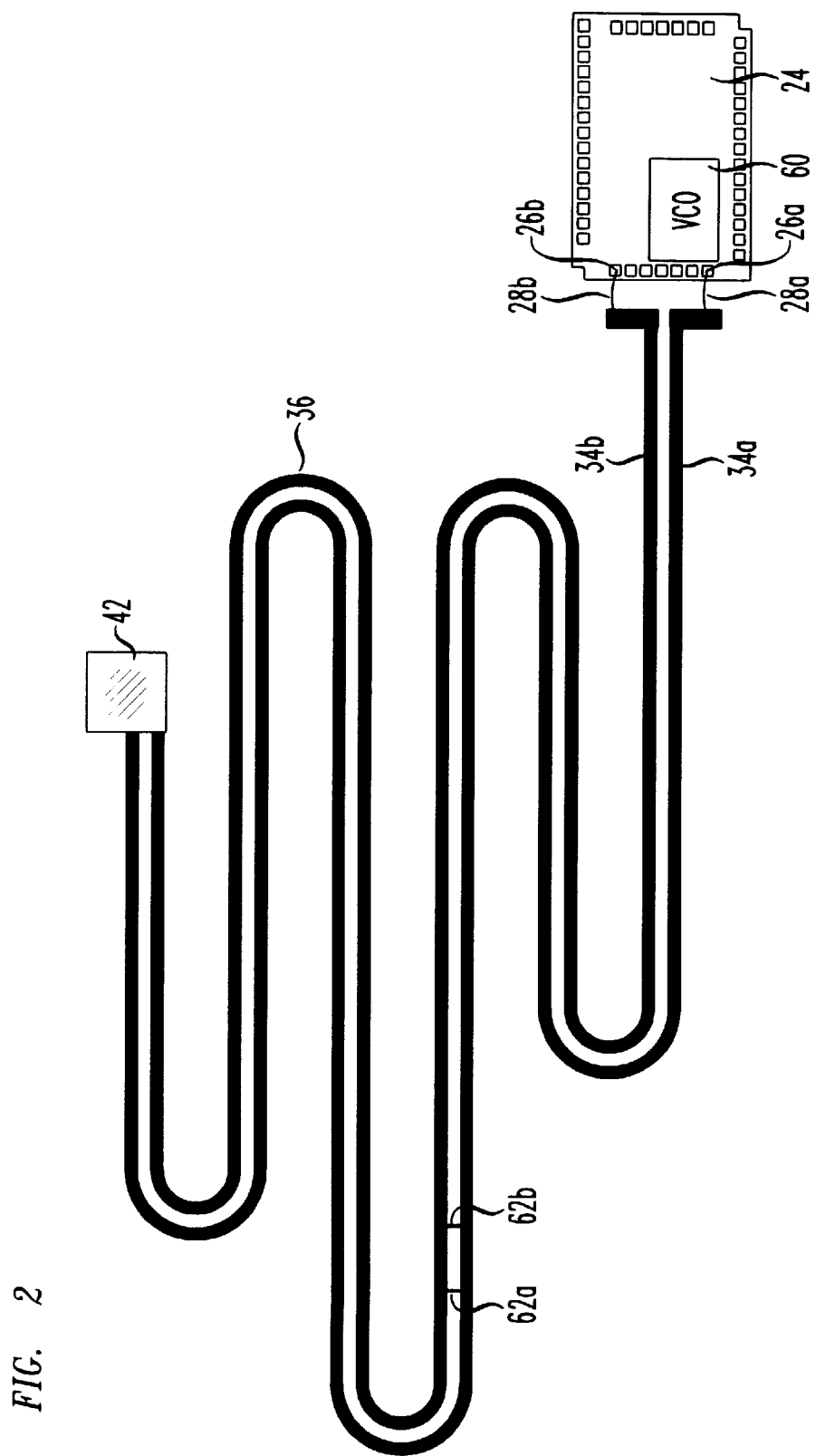
FIG. 2 is an enlargement of a portion of the hybrid integrated circuit of FIG. 1.

In accordance with the invention, upon manufacturing a hybrid integrated circuit 20, a first stub short 62a (see FIGS. 1 and 2) is placed at a first location along conductive runners 34a and 34b to short the conductive runners 34a and 34b, thereby forming a first stub 36a having a first stub length. Stub short 62a is placed at a location based on theoretical or empirical determination of the resulting frequency of operation of voltage controlled oscillator 60. The location for the first stub short 62a is selected such that the resulting frequency of operation of voltage controlled oscillator 60 is preferably lower than a desired frequency of operation of voltage controlled oscillator 60. Stub short 62a is precisely placed along and secured, such as by bonding, to conductive runners 34a and 34b such as by an automatic wire bond machine referenced to a known reference or set of references on hybrid integrated circuit 20.

Subsequently, voltage controlled oscillator 60 is powered and tested such as on a test set. The actual frequency of operation of voltage controlled oscillator 60 due to stub short 62a is determined. Knowing the desired frequency of operation of voltage controlled oscillator 60, the geometry of stub 36, and the actual frequency of operation of due to stub short 62a, a location along stub 36 for placement of a second stub short 62b is determined. The second stub short 62b position may be determined either as a displacement from the first stub short 62a, or relative to a known reference or set of references on hybrid integrated circuit 20, such as reference positions for a wire bonding machine. The second stub short is secured, such as by bonding, to conductive runners 34a and 34b, such as by the automatic bonding machine.

The wire bonding machine has the capability to very precisely locate each end of a stub short 62 relative to reference positions on the hybrid integrated circuit. The location along straight conductive runners forming stub 36 for second stub short 62b may be determined by the test set, such as by $$\text{displacement} = k\left(\frac{1}{f_{oper}} - \frac{1}{f_{desired}}\right) \quad (1)$$

where:
   displacement is a distance, in centimeters, along the stub
   $f_{oper}$ is the frequency of operation, in Hz, due to the first stub short
   $f_{desired}$ is the desired frequency of operation, in Hz, and k is a constant, determined empirically or theoretically.

Equation (1) assumes that both ends of the second stub short 62b are displaced equal distance from corresponding ends of stub short 62a on the same conductive runner, although the invention is not limited thereto. In this manner, the physical length of the tuning stub is changed by the displacement distance as determined by Equation (1). A positive displacement means the stub length should be decreased. A negative displacement means the stub length should be increased. Equation (1) may be modified to include an offset displacement for temperature compensation.

One skilled in the art could modify equation 1 to accommodate geometries of other than straight conductive runners, such as a radius segment of a tuning stub, or to displace one end of a stub short 62b to be more or less distant from a corresponding end of stub short 62a on the same conductive runner.

With a second stub short 62b applied, should the first stub short 62a result in a shorter stub length than the second stub short 62b, the first stub short 62a would be modified so as to have no influence on the frequency of operation, such as being severed or removed. There is no need to modify, sever or remove the first stub short 62a if the first stub short 62a results in a longer stub than the second stub short 62b.

Figure 3:
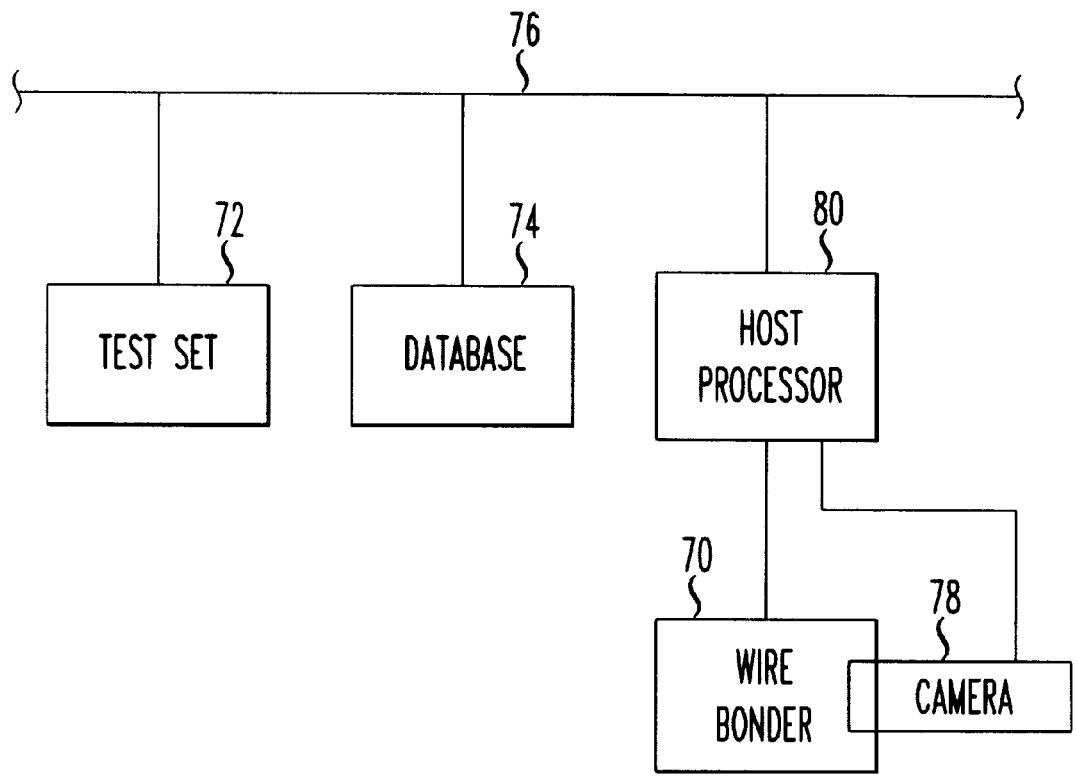
FIG. 3 is a schematic diagram of a system to automate tuning voltage controlled oscillators and precisely position stub shorts.

FIG. 3 illustrates a system for fine tuning the frequency of operation of voltage controlled oscillator 60. Hybrid integrated circuit 20 is positioned on a wire bonder 70. When positioned on wire bonder 70, hybrid integrated circuit 20 is positioned relative to known references, including angular orientation, so that the position of each point on hybrid integrated circuit 20 is known relative to the references of the wire bonder. The layout of features on hybrid integrated circuit 20 are provided to wire bonder 70.

A first stub short 62a is secured on conductive runners 34 at a location selected as described above. Voltage controlled oscillator 60 is powered and tested, such as on test set 72, for the frequency of operation due to the presence of first stub short 62a. The test set 72, employing Equation (1), calculates the displacement required to secure a second stub short to fine-tune voltage controlled oscillator 60 to operate at the desired frequency. The position of ends of first stub short 62a, the frequency of operation as well as the displacement calculated using Equation (1) and other parameters such as the temperature of substrate 22, along with the serial number of the hybrid integrated circuit as observed by camera 78 are collected by the test set, transferred over local area network 76 and stored in database 74. Other identifiers than the serial number, such as a bar code, may be employed. When other identifiers are employed, camera 78 may be replaced with another device, such as a bar code reader. Alternatively, the displacement calculated by Equation (1) can be generated for a range of $f_{oper}$ values, and the corresponding displacements stored in a look-up table. Such a technique would eliminate the on-line calculation and substitute a table look-up based on $f_{oper}$ to determine the displacement. Either $f_{oper}$ or the displacement may be stored.

Hybrid integrated circuit 20 is again placed on wire bonder 70, typically at a later time. Using camera 78, host processor 80 identifies the serial number of hybrid integrated circuit 20 and queries database 74 to obtain the displacement determined by test set 72. The displacement is converted by host processor 80 to represent one of a predetermined number of possible stub short positions along conductive runners 34. For example, the host processor may identify 700 predetermined stub short positions, each with two known end points. The predetermined number of possible stub short positions are preferably at equal spaced intervals, such as 2.54 microns (0.10 mils) increments along conductive runners 34. The predetermined number of possible stub short positions may be symmetrical or asymmetrical about the first stub short 62. Since the first stub short 62 is placed along conductive runners, as described above, to result in a stub length that is longer than the stub length to cause voltage controlled oscillator 60 to operate at the desired frequency, it is expected that most of the second stub shorts will be placed along conductive runners 34 to shorten the stub length. Thus, an asymmetric distribution of the predetermined number of possible stub short positions is preferable.

Figure 4:
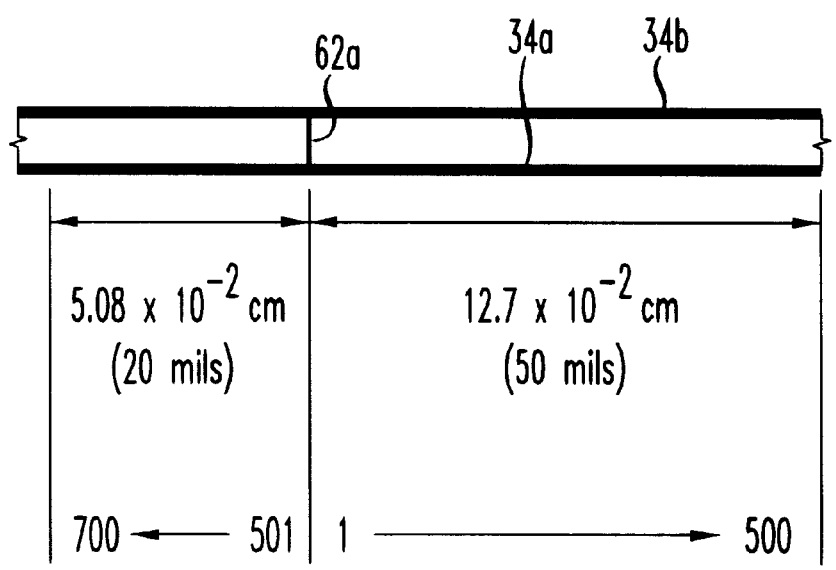
FIG. 4 is a passive asymmetric arrangement of possible stub short positions.

As shown in FIG. 4, the predetermined number of possible stub short positions may be asymmetrically distributed relative to the location of first stub short 62a. FIG. 4 shows $12.7 \times 10^{-2}$ cm (50 mils) representing 500 stub short positions to shorten the stub length. The remaining 200 stub short positions represent $5.08 \times 10^{-2}$ cm (20 mils) stub short positions to lengthen the stub length.

Once the displacement from first stub short 62, or distance as calculated by Equation (1) is determined, the distance must be translated to represent one of the 700 predetermined stub short positions. By way of further example, if the distance is determined to be $3.74 \times 10^{-2}$ cm (14.7 mils), a second stub short is secured in the predetermined stub short position determined by ten times the distance in mils, or stub short position 147. As indicated above, a positive distance indicates shortening the stub length. By way of another example, if the distance determined by Equation (1) is negative, such as $-1.295 \times 10^2$ cm (−5.1 mils), the predetermined stub short position is determined by adding to 500 ten times the absolute value of the distance. Thus, for a distance of $-1.295 \times 10^2$ cm (−5.1 mils), a second stub short is positioned in predetermined stub short position 551. As indicated above, a negative distance as calculated by Equation (1) means the stub length should be increased.

What is claimed is:

1. A method of tuning a tuning dependent quantity of a stub tunable device, comprising the steps of:

selecting a desired tuning dependent quantity of the stub tunable device;

electrically shorting two conductive runners of a tuning stub at a first position along the tuning stub;

testing the stub tunable device to determine the tuning dependent quantity;

determining a second position along the tuning stub that a short should be placed to produce the desired tuning dependent quantity of the stub tunable device; and using automated positioning equipment to electrically short the two conductive runners of the tuning stub at the second position along the tuning stub.

2. A method as recited in claim 1, wherein the step of electrically shorting two conductive runners of a tuning stub at a first position along the tuning stub comprises using automated positioning equipment to electrically short the two conductive runners.

3. A method as recited in claim 1, wherein the step of using automated positioning equipment comprises wire bonding a wire to electrically short the two conductive runners.

4. A method as recited in claim 1, further comprising the step of removing the electrical short at the first position along the tuning stub.

5. A method as recited in claim 1, wherein the determining step determines the second position as a displacement from the first position.

6. A method as recited in claim 1, wherein the determining step determines the second position relative to references known to automated positioning equipment.

7. A method as recited in claim 1, wherein the stub tunable device is an oscillator.

8. A method as recited in claim 7, wherein the tuning dependent quantity is frequency.

9. A product manufactured by the process of claim 1.

10. A product manufactured by the process of claim 2.

11. A product manufactured by the process of claim 3.

12. A product manufactured by the process of claim 4.

13. A method of tuning a stub tunable device, comprising the steps of:

- selecting a desired tuning dependent quantity of the stub tunable device;
- electrically shorting two conductive runners of a tuning stub at a first position along the tuning stub;
- testing the stub tunable device to determine the tuning dependent quantity;
- determining a second position along the tuning stub that a short should be placed to produce the desired tuning dependent quantity of the stub tunable device;
- along the conductive runners, defining a predetermined number of possible second stub short positions proximate the first position;
- selecting one of the predetermined number of possible second stub short positions as the second position; and
- using automated positioning equipment to electrically short the two conductive runners of the tuning stub at the second position along the tuning stub.

14. A method as recited in claim 13, wherein defining the predetermined number of possible stub short positions proximate the first position, comprises defining the predetermined number of possible stub short positions at equal intervals along the conductive runners.

15. A method as recited in claim 13, wherein defining the predetermined number of possible second stub short positions proximate the first position comprises:

defining an asymmetric distribution of possible second stub short positions about the first position.

16. A method as recited in claim 13, wherein defining the predetermined number of possible second stub short positions proximate the first position comprises:

defining a symmetric distribution of possible second stub short positions about the first position.

17. Apparatus for tuning a stub tunable device, comprising:

- a wire bonder for receiving a substrate on which the stub tunable device is fabricated;
- a detector for determining a unique substrate identifier;
- a database couplable to a host processor, the database accessible to retrieve a tuning dependent quantity based on an input of the unique substrate identifier; and
- a host processor coupled to the wire bonder and to the detector for communicating therewith, the host processor capable of identifying which one of a predetermined number of possible stub short positions at which a stub short should be placed to fine tune the tuning dependent quantity of the stub tunable device, the wire bonder adapted to receive from the host processor the identified one of the predetermined number of possible stub short positions, the wire bonder adapted to secure a stub short thereat.

18. Apparatus as recited in claim 17, wherein the detector is a camera.

* * * * *